US012807083B2

(12) United States Patent
Miller et al.

(10) Patent No.: US 12,807,083 B2
(45) Date of Patent: Nov. 24, 2026

(54) CAMERA BRACKET ASSEMBLY

(71) Applicant: ILLINOIS TOOL WORKS INC., Glenview, IL (US)

(72) Inventors: Karly R. Miller, Lemont, IL (US); Christopher T. Schaafsma, Wheaton, IL (US); Craig W. Gurtatowski, Crown Point, IN (US); Danny C.F. Leitao, Skokie, IL (US); Dennis M. Mark, Hawthorn Woods, IL (US); Edward F. Bulgajewski, Genoa, IL (US); Scott Bair, Skokie, IL (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 559 days.

(21) Appl. No.: 17/691,398

(22) Filed: Mar. 10, 2022

(65) Prior Publication Data

US 2022/0289126 A1 Sep. 15, 2022

Related U.S. Application Data

(60) Provisional application No. 63/161,103, filed on Mar. 15, 2021.

(51) Int. Cl.

| | |
|---|---|
| ***B60R 16/02*** | (2006.01) |
| ***B60R 11/04*** | (2006.01) |
| ***B60S 1/02*** | (2006.01) |
| ***H05K 1/18*** | (2026.01) |

(52) U.S. Cl.

CPC .............. *B60R 16/02* (2013.01); *B60R 11/04* (2013.01); *B60S 1/026* (2013.01); *H05K 1/18* (2013.01)

(58) Field of Classification Search

CPC . B60R 11/04; B60R 2011/0026; B60R 16/03; B60R 1/04; H05K 1/18; H04N 5/2257; H04N 5/2252; G01D 11/245

See application file for complete search history.

(56) References Cited

U.S. PATENT DOCUMENTS

2006/0061008 A1* 3/2006 Karner .................. G09G 5/026 264/250
2014/0069714 A1* 3/2014 Uttermann ............. H01R 13/74 174/650
2014/0160284 A1* 6/2014 Achenbach ............ H04N 23/55 29/854
2014/0226012 A1 8/2014 Achenbach
(Continued)

FOREIGN PATENT DOCUMENTS

DE 102010023293 A1 12/2011
DE 102010052472 A1 5/2012
(Continued)

OTHER PUBLICATIONS

International Search Report and Written Opinion for PCT/US2022/019887, dated Jul. 4, 2022 (10 pages).
(Continued)

*Primary Examiner* — Xi Wang
(74) *Attorney, Agent, or Firm* — Quarles & Brady LLP

(57) ABSTRACT

A bracket assembly for a vehicle includes a bracket body having a glare shield and a circuit. The bracket assembly further includes an electrical device that is electrically connected to the circuit of the bracket body. The circuit comprises a plurality of leads extending along the bracket body.

18 Claims, 10 Drawing Sheets

(56) References Cited

U.S. PATENT DOCUMENTS

| | | | | |
|---|---|---|---|---|
| 2014/0286015 | A1* | 9/2014 | Wang | F21K 9/20 362/294 |
| 2014/0298642 | A1* | 10/2014 | Sesti | G02B 27/0025 29/592.1 |
| 2015/0205186 | A1 | 7/2015 | Park et al. | |
| 2015/0251605 | A1* | 9/2015 | Uken | H04N 23/51 248/467 |
| 2015/0263442 | A1* | 9/2015 | Bakatsias | H01R 12/75 439/78 |
| 2016/0229346 | A1* | 8/2016 | Oh | B60R 11/04 |
| 2016/0355135 | A1* | 12/2016 | Koetje | B60R 1/04 |
| 2017/0194721 | A1* | 7/2017 | Fan | H01R 12/57 |
| 2018/0027151 | A1 | 1/2018 | Kazama et al. | |
| 2018/0056871 | A1* | 3/2018 | Karner | B60R 1/12 |
| 2018/0316833 | A1 | 11/2018 | Okuda | |
| 2019/0047475 | A1* | 2/2019 | Uken | B60R 1/088 |
| 2019/0251840 | A1* | 8/2019 | Kukimoto | B60K 35/29 |
| 2019/0353989 | A1* | 11/2019 | Kesavamatham | B60R 11/04 |
| 2020/0404138 | A1* | 12/2020 | Wang | H04N 7/183 |
| 2021/0302703 | A1* | 9/2021 | Furutake | H04N 23/55 |
| 2022/0009424 | A1* | 1/2022 | Kirchhoff | H01Q 1/3233 |

FOREIGN PATENT DOCUMENTS

| | | | |
|---|---|---|---|
| DE | 102019200990 | A1 | 7/2020 |
| DE | 102019213124 | A1 | 3/2021 |
| EP | 3168084 | A1 | 5/2017 |
| JP | 2019137289 | A | 8/2019 |

OTHER PUBLICATIONS

International Search Report and Written Opinion for PCT/US2022/019890, dated Jul. 5, 2022 (10 pages).

* cited by examiner

S100
PROVIDE BRACKET BODY, GLARE SHIELD, CIRCUIT BOARD, AND ELECTRICAL COMPONENTS

↓

S104
CONNECT SENSORS TO CIRCUIT BOARD TO FORM SUBASSEMBLY

↓

S108
ATTACH SUBASSEMBLY TO BRACKET BODY

CAMERA BRACKET ASSEMBLY

RELATED APPLICATIONS

This application claims priority benefits from U.S. Provisional Application No. 63/161,103 filed Mar. 15, 2021, and entitled "Camera Bracket Assembly," which is hereby incorporated by reference in its entirety.

BACKGROUND

Bracket assemblies may be used in a variety of applications, including automobile manufacturing. For example, automated driver assistance systems, such as lane departure warning systems, may comprise bracket assemblies for mounting a camera, among other electrical devices, on a front windshield or a rear windshield of a vehicle. Typical prior art camera bracket assemblies require multiple wire harnesses to power components on a bracket body. Such conventional camera bracket assemblies add complexity to the number of materials used and take a long time to assemble. Further, such conventional camera bracket assemblies may require large packaging to accommodate an ergonomic clearance of the multiple wire harnesses.

SUMMARY

In one aspect, a bracket assembly for a vehicle includes a bracket body having a glare shield and a circuit. The bracket assembly further includes an electrical device that is electrically connected to the circuit of the bracket body. The circuit comprises a plurality of leads extending along the bracket body In some embodiments, the electrical device is connected to a contact pad that is integrally formed on the bracket body. A spring-loaded contact is provided between the electrical device and the circuit. In some embodiments, the electrical device includes at least one of a heater, a camera, a humidity sensor, a rain sensor, or a port. A wire harness is provided between the circuit and a power source. The wire harness is a two-pin wire harness or a three-pin wire harness. In some embodiments, the glare shield is removably attached to the bracket body. In one embodiment, the leads are integrally formed with the bracket body.

In another aspect, a bracket assembly for a vehicle includes a bracket body, an electrical device, and a circuit carrier that is attached to the bracket body. The electrical device is electrically connected to a terminal block provided on the circuit carrier.

In some embodiments, the circuit carrier is attached to a bottom side of the bracket body. In one embodiment, a glare shield is attached to the bracket body. In some embodiments, the circuit carrier is positioned along a trailing end of the bracket body. In some embodiments, the electrical device includes at least one of a heater, a camera, a humidity sensor, a rain sensor, or a port. The bracket body includes a retention portion and the electrical device includes a retaining clip that is configured to engage the retention portion.

In still another aspect, a method of assembling a bracket assembly for a vehicle includes providing a bracket body and a glare shield, providing a circuit carrier and a plurality of electrical devices, attaching the circuit carrier and the plurality of electrical devices to the bracket body, and installing the bracket assembly within the vehicle.

In some embodiments, the electrical devices are connected to the circuit carrier to form a circuit subassembly that is subsequently attached to the bracket body. Each electrical device of the plurality of electrical devices is connected to the circuit carrier before being attached to the bracket body. The electrical devices include at least one of a heater, a camera, a humidity sensor, a rain sensor, or a port. In some embodiments, the circuit carrier is attached to a bottom side of the bracket assembly by a fastener. In some embodiments, the circuit carrier includes a plurality of terminal blocks of different configurations. The circuit carrier includes a first terminal block on a first side and a second terminal block on a second side that is opposite the first side.

DETAILED DESCRIPTION

Generally, the present disclosure includes a bracket assembly that allows for an efficient assembly and installation process in which electrical devices, e.g., heaters, cameras, sensors, ports, or other electrical devices, are connected to a circuit that is provided with or as a part of a bracket body. The electrical devices are connected to the circuit via contact pads or spring-loaded contacts or terminal blocks on the bracket body, as opposed to each of the electrical devices being individually wired using several cumbersome and space-consuming harnesses or loose wires for receiving power. In some embodiments, bracket assemblies of the present disclosure require only a single wire harness connected to a bracket body to deliver power via leads, contact pads, terminal blocks, and spring-loaded contacts to electrical devices. In this way, the efficient installation process requires less time for installation, less parts to install, and less quality issues from unsatisfactory installation. Therefore, the bracket assemblies require smaller packaging. Additionally, bracket assemblies of the present disclosure have the advantage of a more ergonomic design than conventional bracket assemblies, since the installer is able connect the electrical devices to the circuit at a workstation where the workpiece, i.e., the bracket assembly, is rested on a surface over which the installer can work, rather than the workpiece being positioned above the installer's head or in hard-to-reach, awkward locations within the vehicle.

Figure 1:
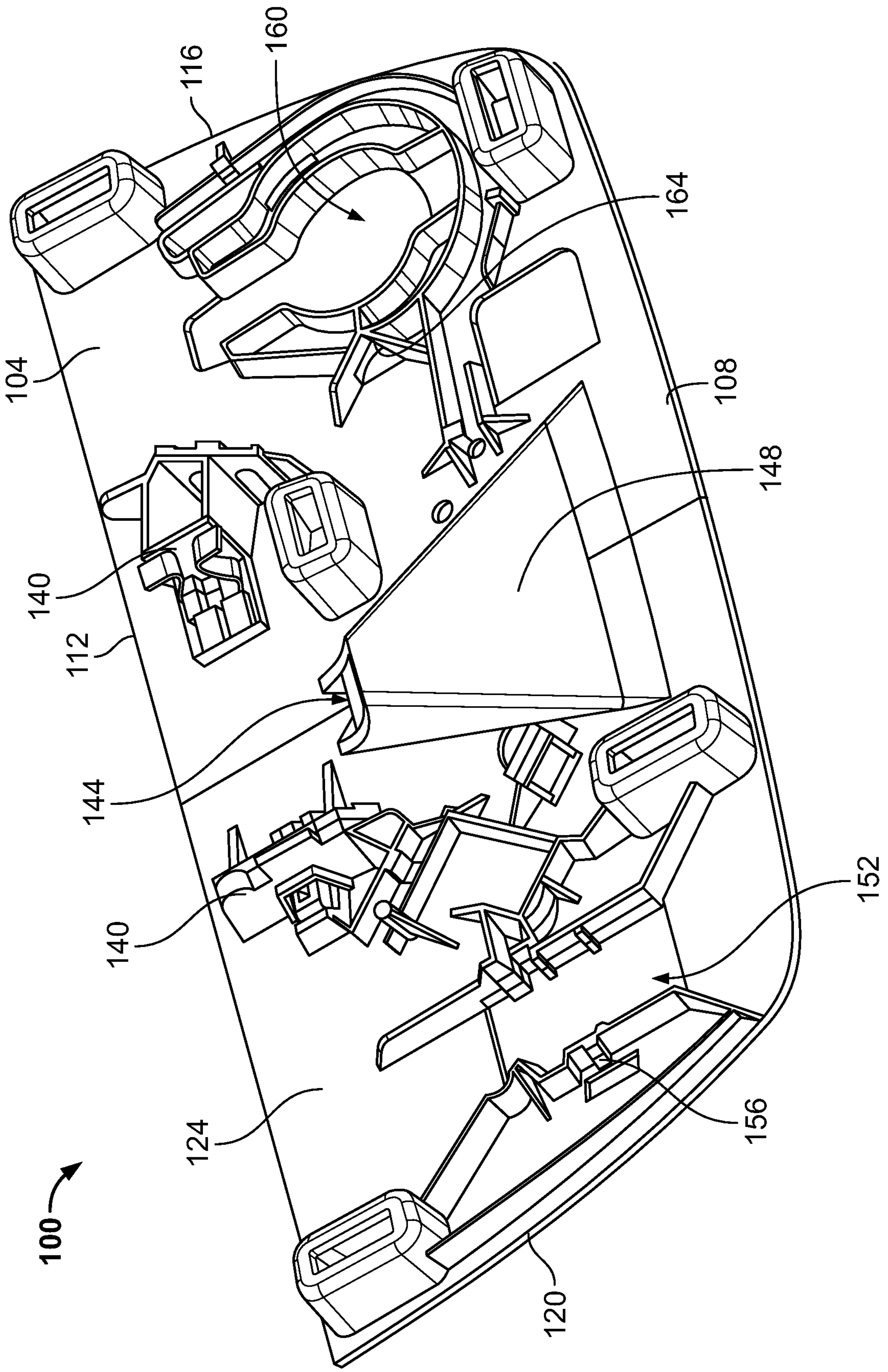
FIG. 1 is schematic representation of an isometric view of a bracket assembly for a camera including a bracket body and a glare shield.

FIG. 1 depicts a bracket assembly 100 including a bracket body 104 that is a generally rectangular shaped bracket including a leading end 108 opposite a trailing end 112, a left side 116 opposite a right side 120, and a first side or bottom side 124 opposite a second side or top side 128. When the bracket assembly 100 is mounted to a windshield 132 of a vehicle 136 (see FIG. 12), the leading end 108 is positioned forwardly of the trailing end 112 relative to the front of the vehicle 136. The bracket body 104 further includes a number of areas for holding electrical devices. For example, the bracket body 104 may include camera mounting clips 140 centrally located on the bottom side 124 of the bracket body 104. The camera mounting clips 140 are configured to hold or secure portions of a camera (not shown) such that a lens of the camera (not shown) may be positioned at or extend through an aperture 144. The bracket body 104 includes a trapezoidal-shaped glare shield 148 that at least partially defines the aperture 144 and slopes outwardly from the bottom side 124 between the leading end 108 and the trailing end 112. In the illustrated embodiment, the glare shield 148 may be integrally formed with the bracket body 104, although other configurations are possible.

Additionally or alternatively, the bracket body 104 may include electrical device areas or receptacles. In the illustrated embodiment, the bracket body 104 may include a first electrical device area or first receptacle 152 that is positioned near the right side 120 of the bracket body 104 and has a first retention portion 156. It is contemplated that the first receptacle 152 and the first retention portion 156 are configured to engage a electrical device, e.g., a humidity sensor. The bracket body 104 may also include a second electrical device area or second receptacle 160 that is positioned near the left side 116 of the bracket body 104 and has a second retention portion 164. It is contemplated that the second receptacle 160 and the second retention portion 164 are configured to engage another electrical device, e.g., a rain sensor. In some embodiments, the bracket body 104 may include a plurality of electrical device areas or receptacles configured to engage other types of electrical devices, such as, e.g., heaters, cameras, light detection and ranging (LIDAR) sensors or radio detecting and ranging (RADAR) sensors, or a USB port or a USB-C port, among other types of electrical devices. In other embodiments, the bracket body 104 may include any number of areas for holding electrical devices, including power sources, controllers, cameras, sensors, or any other electrical devices and the areas for holding electrical devices may be in a suitable locations.

Figure 2:
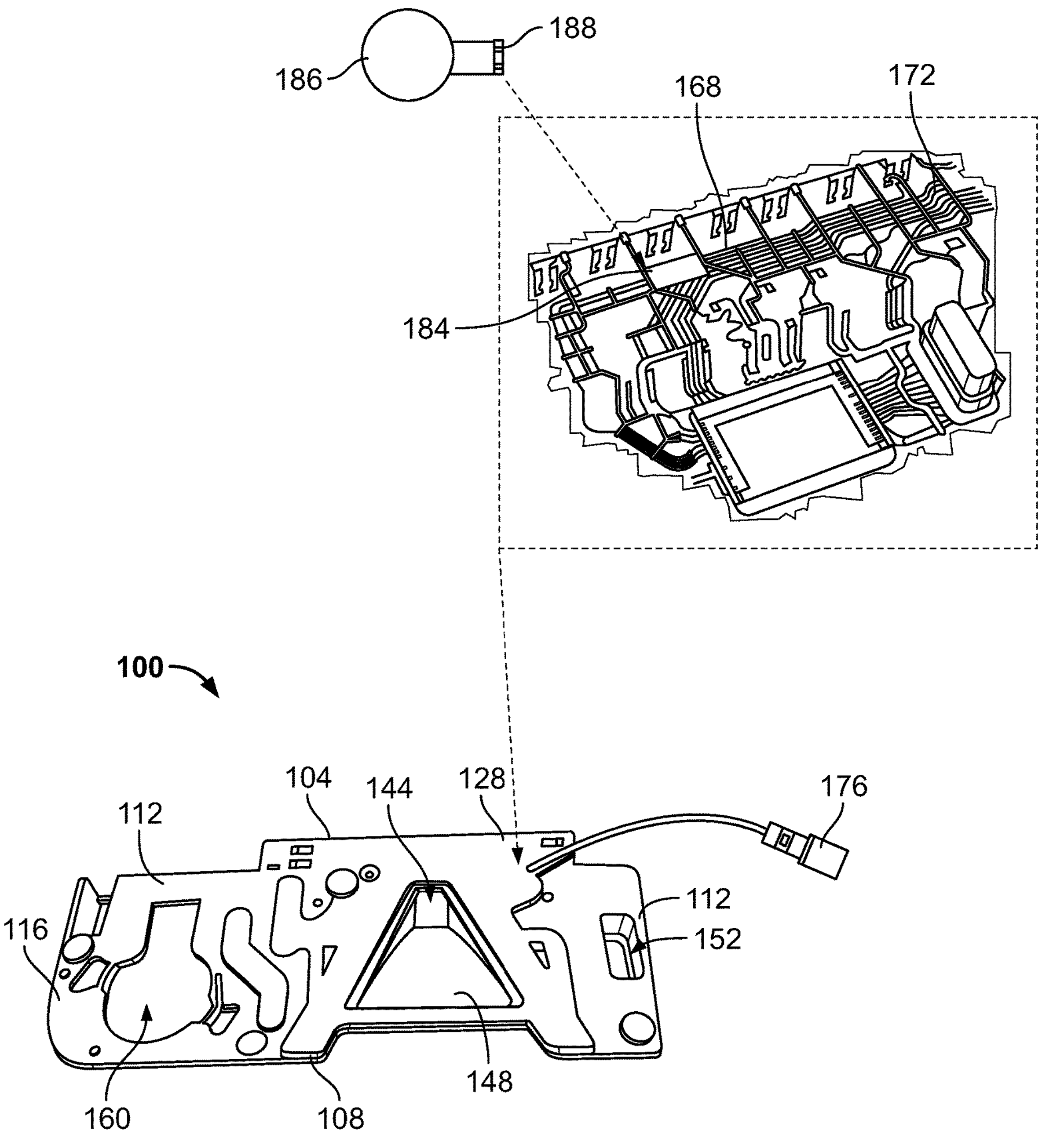
FIG. 2 is a schematic representation of a partial, enlarged view of the bracket assembly of FIG. 1 with leads integrally formed in a bracket body.

FIG. 2 depicts the bracket assembly 100 of FIG. 1, and further shows leads 168 integrally formed with the bracket body 104. In the illustrated embodiment, the bracket body 104 may be made of a polymer material, such as, e.g., a thermoplastic material. The leads 168 may be integrally formed with the bracket body 104 by, e.g., a molding process or an insert molding process. The leads 168 form a circuit 172 that provides communication lines between a power source (not shown) and/or a controller (not shown) and electrical devices. Accordingly, the circuit 172 is integrally formed with the bracket body 104. In some embodiments, the leads 168 provide electrical communication from the power source (not shown), e.g., the battery or alternator of the vehicle or from a solar array or a capacitor, to the electrical device in the first receptacle 152, the electrical device in the second receptacle 160, and the camera (not shown) secured by the camera mounting clips 140. Further, the leads 168 provide an electrical connection between the controller (not shown), such as, e.g., the central processing unit (CPU) of the vehicle or a secondary controller or processing unit, and the electrical device in the second receptacle 160 and the camera (not shown) secured by the camera mounting clips 140.

The bracket body 104 may also include terminal blocks (not shown) thereon for connection to the leads 168 and the electrical devices in the first receptacle 152, the second receptacle 160, the camera (not shown) secured to the camera mounting clips 140, the power source (not shown), and the controller (not shown). In another example, the leads 168 may provide electrical connections via flexible flat connectors (FFC), such as, e.g., a two-pin wire harness 176 or a three-pin wire harness 180 (see FIGS. 6 and 7). The leads 168 may be configured to provide power to electrical device areas on the bracket body 104, such as the first receptacle 152 and the second receptacle 160. Additionally or alternatively, the leads 168 may be configured to provide power to any electrical device on or near the bracket body 104, such as, e.g., a heater, a camera, a LIDAR sensor, a humidity sensor, a rain sensor, a RADAR sensor, a USB or USB-C port, or any other electrical devices.

Further referring to FIG. 2, the bracket body 104 may include a contact pad 184 that forms an electrical connection between the leads 168 and an electrical device 186 on the bracket body 104. The contact pad 184 may comprise one contact pad, two contact pads, three contact pads, or any suitable number of contact pads and may be equivalent to or different from the number of electrical devices. The electrical device 186 is provided with or is modified to include a spring-loaded contact 188 and retention clips (not shown) that are configured to engage the retention portions 156, 164 of the bracket body 104. Accordingly, the contact pad 184 may be configured to receive the corresponding spring-loaded contact 188 located on the electrical device 186, thereby allowing electricity to travel from the leads 168 of the circuit 172 through the contact pad 184 and through the spring-loaded contact 188 to the electrical device. The retention portions 156, 164 of the bracket body 104 cooperate with the retaining clips (not shown) of the electrical devices to apply pressure between the spring-loaded contacts 188 and the corresponding contact pads 184, thereby securing the electrical devices to the bracket body 104 and establishing an electrical connection. The bracket body 104 may be otherwise configured to secure the electrical devices to the bracket body 104, e.g., by a press fit configuration, pin connection, snap attachment, slidable attachment, or adhesive.

Figure 3:
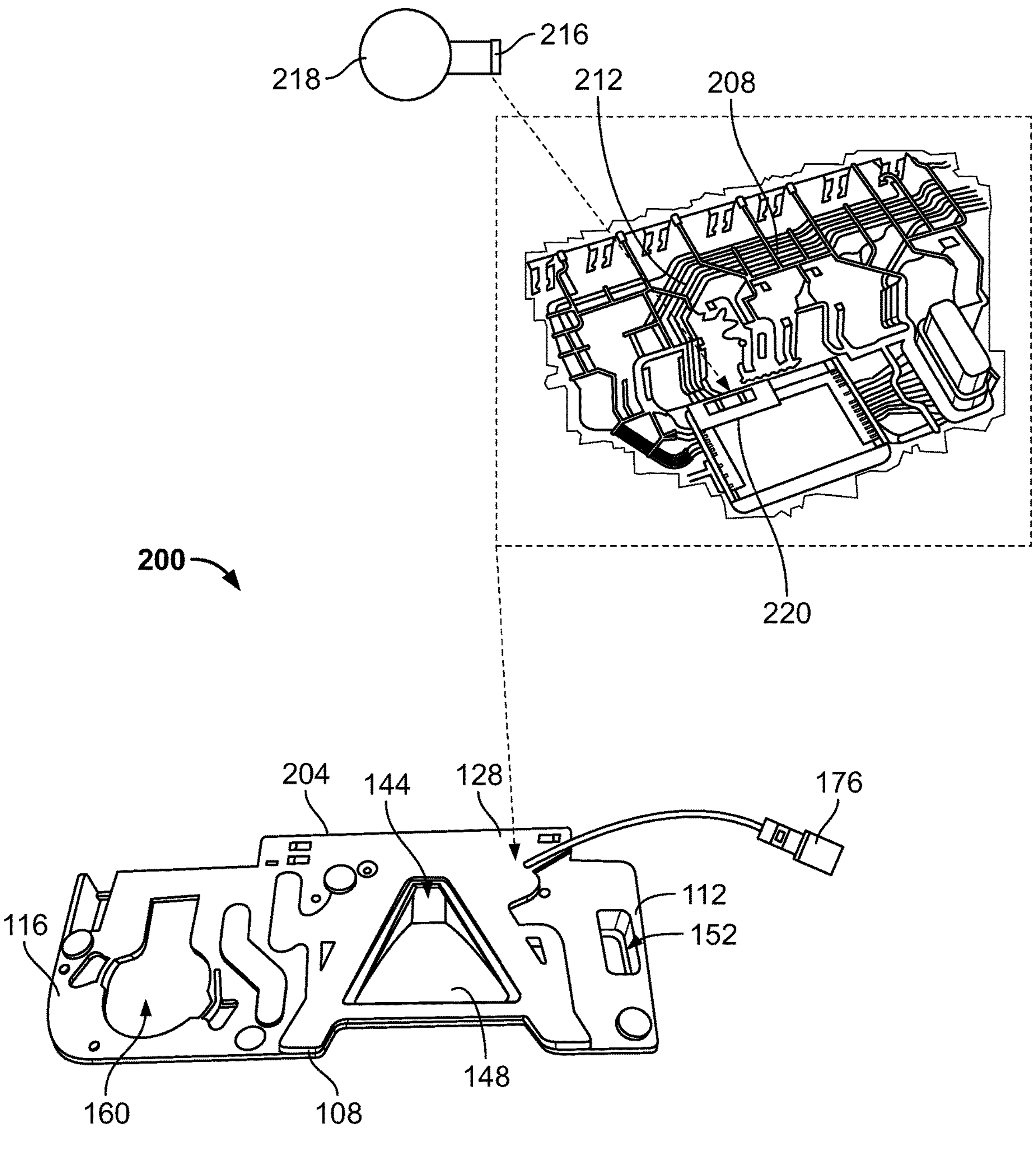
FIG. 3 is a schematic representation of a partial, enlarged view of a bracket assembly similar to the bracket assembly of FIG. 1 with leads integrally formed in a bracket body.

FIG. 3 depicts another embodiment of a bracket assembly 200 having a bracket body 204 with leads 208 applied to or formed on the bracket body 204. The bracket assembly 200 is substantially similar to the bracket assembly 100 (see FIGS. 1 and 2) except for the components discussed herein. The leads 208 of the bracket assembly 200 form a circuit 212 on the bracket body 204 for establishing electrical connections among electrical devices. With reference to FIG. 3, a contact pad 216 is attached to an electrical device 218, such as, e.g., a rain sensor, for use with the bracket assembly 200. The bracket assembly 200 further includes a spring-loaded contact 220 attached to the circuit 212 and/or leads 208 and provided as part of the bracket body 204. The spring-loaded contact 220 may connect to the contact pad 216 provided on the electrical device 218 to establish an electrical connection therebetween. In some embodiments, the spring-loaded contact 220 is integrally formed with the bracket body 204 and attached to the leads 208. In other embodiments, the spring-loaded contact 220 is attached to the bracket body 204, e.g., by a press fit configuration, pin connection, snap attachment, slidable attachment, or adhesive. Further, the spring-loaded contact 220 is configured to receive a connector of the electrical device 218, which may be a camera, sensor, or any other electrical device. The spring-loaded contact 220 of the bracket body 204 may comprise one spring-loaded contact, two spring-loaded contacts, three spring-loaded contacts, or any suitable number of spring-loaded contacts, and may be equivalent to or different from the number of contact pads.

Figure 4:
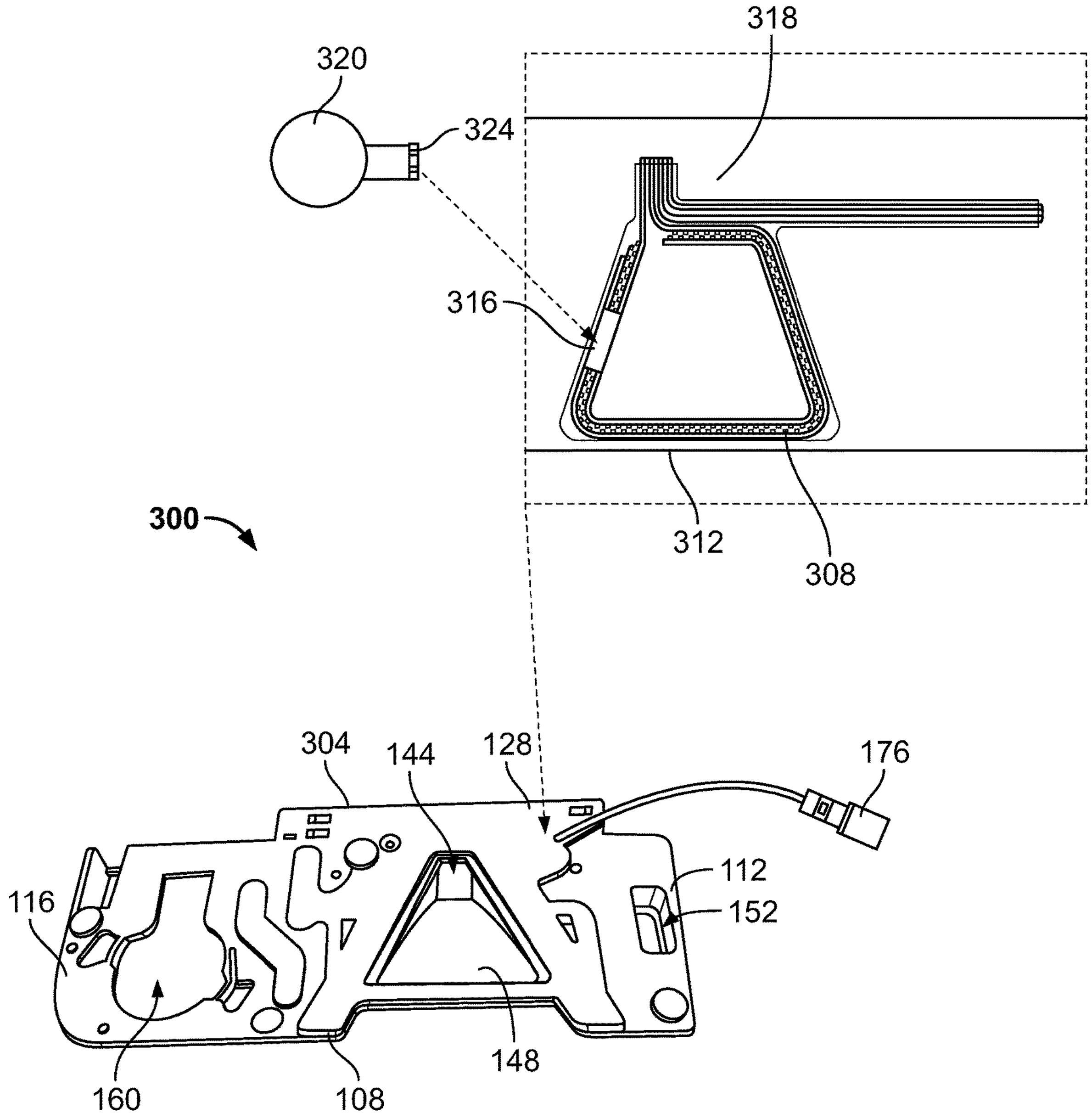
FIG. 4 is a schematic representation of a partial, enlarged view of a bracket assembly similar to the bracket assembly of FIG. 1 with leads integrally formed on a bracket body.

FIG. 4 depicts yet another embodiment of a bracket assembly 300 having a bracket body 304 and leads 308 that form a circuit 312 integrally formed in the bracket body 304. The bracket assembly 300 as depicted in FIG. 4 includes a contact pad 316 attached to the bottom side 124 of the bracket body 304. The bracket assembly 300 is substantially similar to the bracket assembly 100 (see FIGS. 1 and 2) except for the components discussed herein. In the illustrated embodiment, the circuit 312 is provided in the form of a flexible or flex circuit on the bracket body 304. The circuit 312 is formed at least in part by the leads 308 being formed with or on a flexible substrate material 318. The circuit 312 may be integrally formed on or embedded in the bracket body 304. In other embodiments, the circuit 312 is attached to the bracket body 304. Because the circuit 312 is flexible or pliable, it is possible to deform and contort the circuit 312 along the topography of the bracket body 304 to accommodate the limited uninterrupted surface area available on, e.g., the bottom side 124. In some embodiments, the circuit 312 and/or the leads 308 may be integrally formed on the bottom side 124 of the bracket body 304. The leads 308 may be a conductive material that are printed onto the bottom side 124 of the bracket body 304, e.g., the leads 308 may be a copper material, which is well-known for electrical conductance properties. In other examples, the leads 308 are a different metal or metal alloy material, or a composite material, such as, e.g., a screen-printed silver polymer.

In some embodiments, the leads 308 may be printed or stamped or otherwise integrally formed on the bottom side 124 of the bracket body 304 or, alternatively, the leads 308 may be printed or stamped or otherwise integrally formed on the top side 128 of the bracket body 304. It is contemplated that the bracket body 304 and the leads 308 may be formed through additive manufacturing methods during which a layer-by-layer printing process simultaneously forms the bracket body 304 with the leads 308 arranged therein or thereon. For example, the leads 308 may extend within a core (not shown) of the bracket body 304, being sandwiched between the top side 128 and the bottom side 124, and only having portions or ends exposed on the top side 128 or the bottom side 124 of the bracket body 304, where electrical connections can be made.

Figure 6:
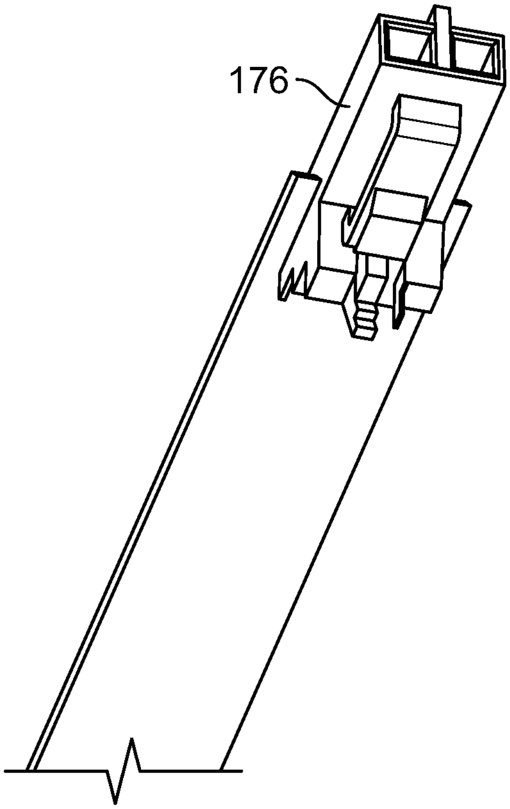
FIG. 6 is a schematic representation of an isometric view of a two pin wire harness.
Figure 7:
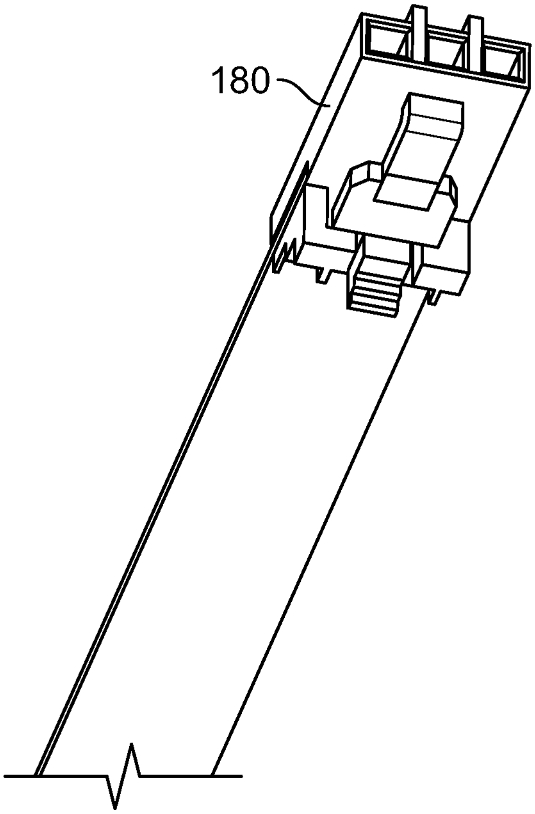
FIG. 7 is a schematic representation of an isometric view of a three pin wire harness.

Referring to FIG. 4, the circuit 312 provides communication lines between a power source (not shown) and/or a controller (not shown) and electronic components, for example, via the two pin wire harness 176 or the three pin wire harness 180 (see FIGS. 6 and 7). The circuit 312 and/or leads 308 may be configured to provide electrical communication to any electronic device on or near the bracket body 304, such as, e.g., a heater, a camera, a LIDAR sensor, a humidity sensor, a rain sensor, a radar sensor, a USB or USB-C port, or any other electrical device. In the illustrated embodiment, an electrical device 320 includes a spring-loaded contact 324 for electrically connecting to the contact pad 316 provided on the circuit 312. The spring-loaded contact 324 may comprise one spring-loaded contact, two spring-loaded contacts, three spring-loaded contacts, or any suitable number of spring-loaded contacts. The contact pad 316 may comprise one contact pad, two contact pads, three contact pads, or any suitable number of contact pads.

Figure 5:
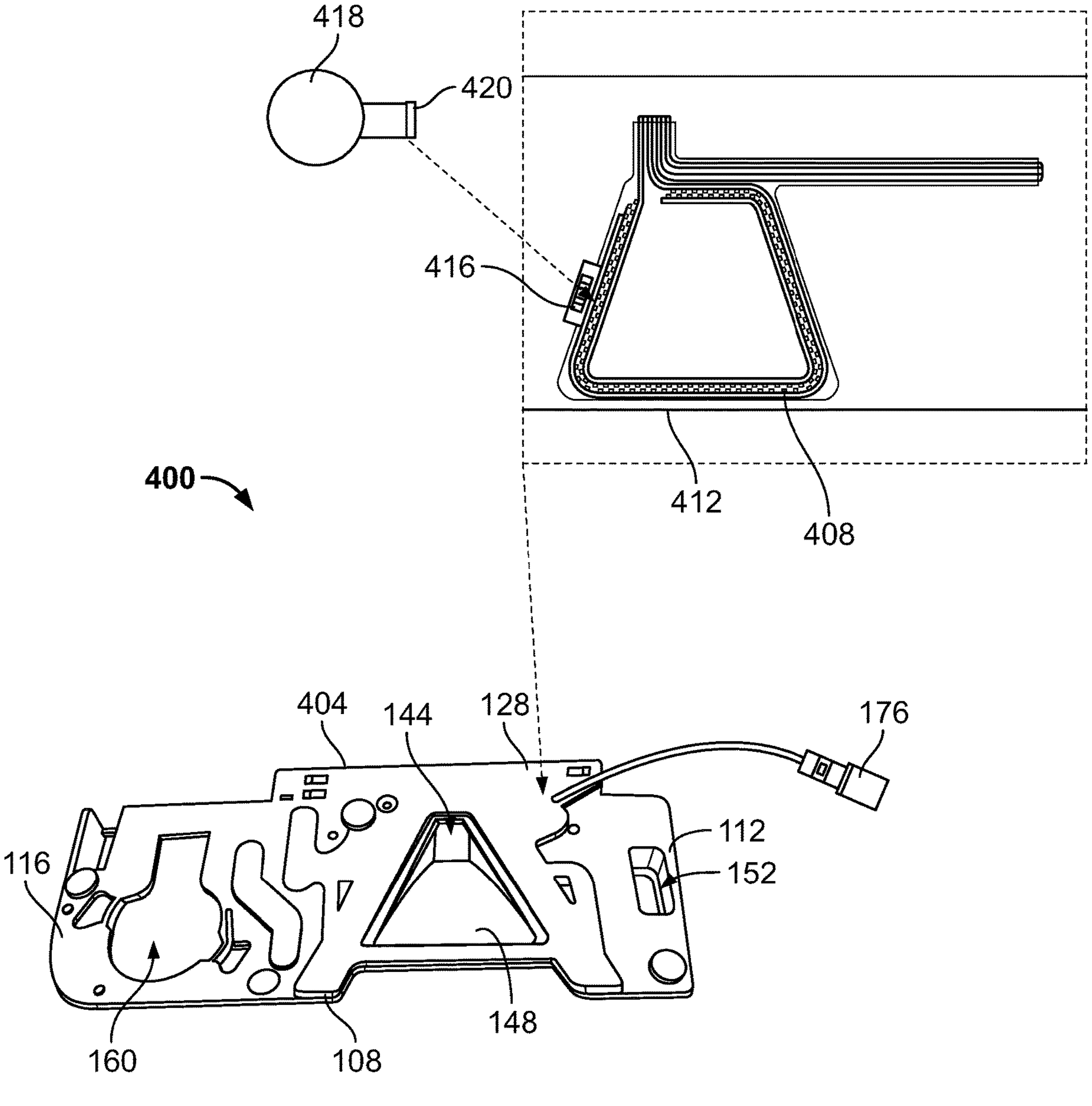
FIG. 5 is a schematic representation of a partial, enlarged view of a bracket assembly similar to the bracket assembly of FIG. 1 with leads integrally formed on a bracket body.

FIG. 5 illustrates still another bracket assembly 400 with a bracket body 404 having a circuit 412 of leads 408 integrally formed with the bracket body 404 and a spring-loaded contact 416 attached to the bottom side 124. The bracket assembly 400 is substantially similar to the bracket assembly 300 (see FIG. 4) except for the components discussed herein. As shown in FIG. 5, the spring-loaded contact 416 is attached to the leads 408. The spring-loaded contact 416 may comprise one spring-loaded contact, two spring-loaded contacts, three spring-loaded contacts, or any suitable number of spring-loaded contacts. The spring-loaded contact 416 may be integrally formed with the bracket body 404 and the leads 408. In other embodiments, the spring-loaded contact 416 may be attached to the bracket body 404, for example, by a press fit configuration, pin connection, snap attachment, slidable attachment, or adhesive. Further, the spring-loaded contact 416 may be configured to receive an electrical device 418, e.g., a rain sensor. The spring-loaded contact 416 may attach to a contact pad 420 on the electrical device 418.

FIGS. 6 and 7 depict a two-pin wire harness 176 and a three-pin wire harness 180, respectively. FIG. 6 illustrates a two-pin wire harness 176 which may be used to provide electrical connections to the bracket assemblies shown in any of FIGS. 2-5. For example, one two-pin wire harness 176 may be connected to the circuit 172 of the bracket body 104 shown in FIG. 2. Accordingly, the two-pin wire harness 176 can provide electrical communication to any electrical devices attached directly or indirectly to the circuit 172 and/or the leads 408. Alternatively, multiple two-pin wire harnesses 176 may be connected to the bracket body 104 shown in FIG. 2 to provide electrical connections to the circuit 172, thereby connecting to any components attached directly or indirectly to the circuit 172 and/or the leads 168.

FIG. 7 shows a three-pin wire harness 180 which may be used to provide electrical connections to the bracket assemblies shown in any of FIGS. 2-5. For example, one three-pin wire harness 180 may be connected to the bracket body 104 shown in FIG. 2 to provide electrical communication to the circuit 172. Accordingly, the three-pin wire harness 180 can provide electrical communication to any components attached directly or indirectly to the circuit 172 and/or the leads 168. Alternatively, multiple three-pin wire harnesses 180 may be connected to the bracket body 104 of FIG. 2 to provide electrical communication to the circuit 172, thereby connecting to any components attached directly or indirectly to the circuit 172 and/or the leads 168.

Figure 8:
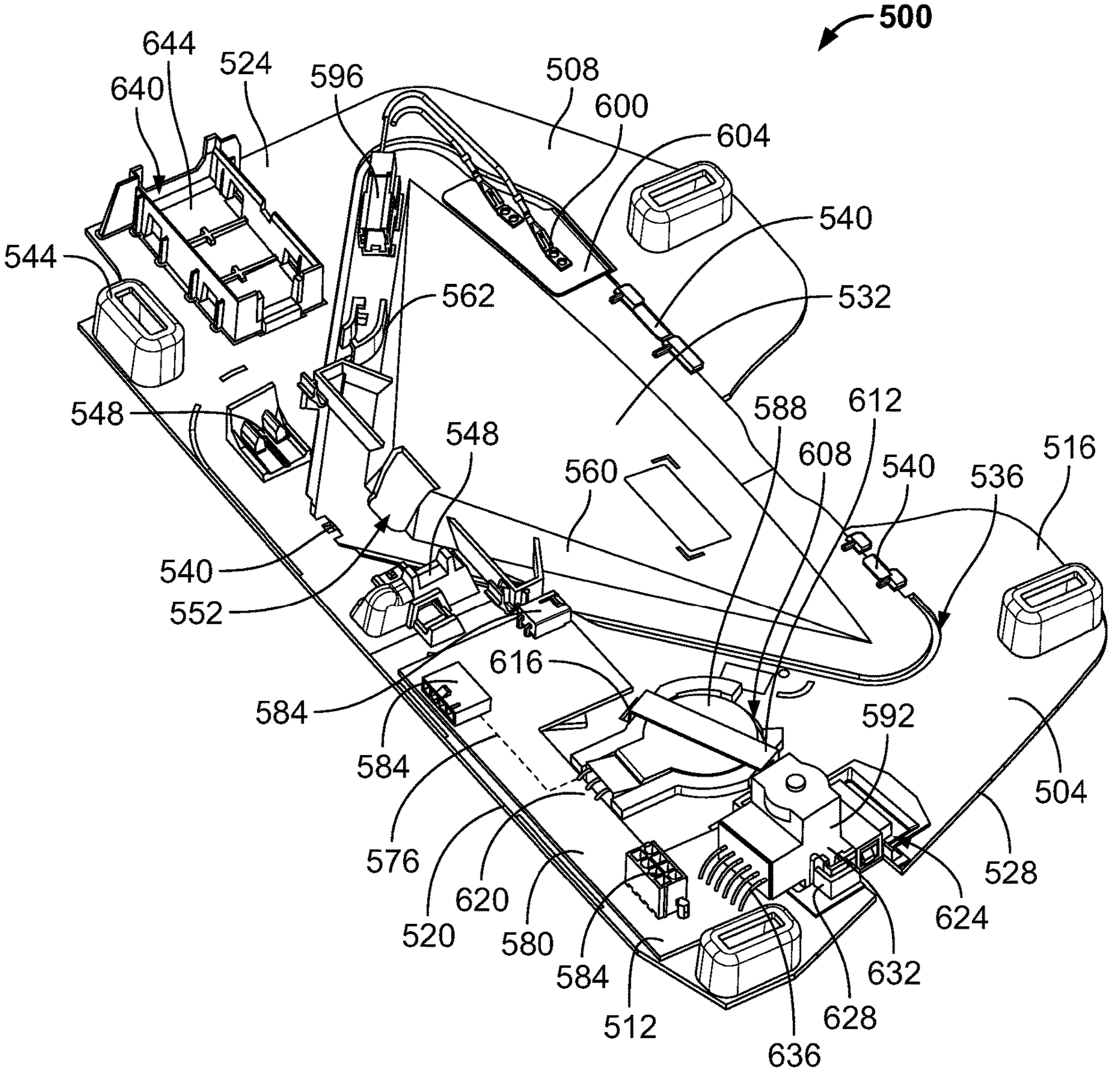
FIG. 8 is a schematic representation of an isometric view of a bottom side of another embodiment of a bracket assembly.
Figure 9:
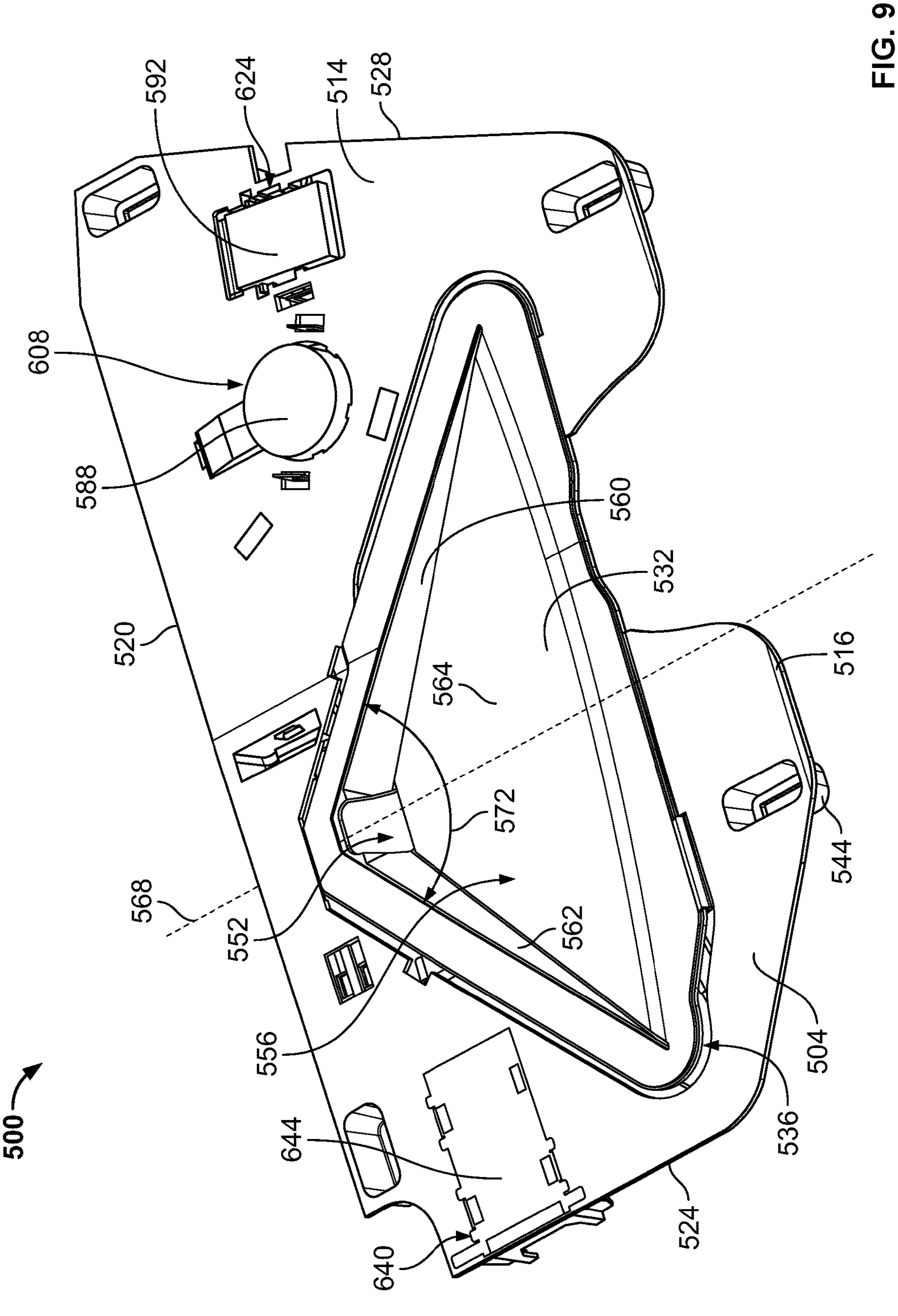
FIG. 9 is a schematic representation of an isometric view of a top side of the bracket assembly of FIG. 8.

FIGS. 8 and 9 illustrate another embodiment of a bracket assembly 500 with a bracket body 504 having a bottom side 508 to which a circuit carrier 512 is attached. The bracket body 504 includes a top side 514 opposite the bottom side 508, a leading end 516 that is opposite a trailing end 520 and a left side 524 that is opposite a right side 528. The bracket assembly 500 includes a glare shield 532 that is positioned between the left side 524 and the right side 528 and also between the leading end 516 and the trailing end 520. In the illustrated embodiment, the glare shield 532 is received within a cutout 536 formed in the bracket body 504, such that the glare shield 532 is positioned within the cutout 536 and coupled to the bracket body 504 by a plurality of clips 540. Further, the bracket body 504 includes bracket mounts 544 that extend from various locations of the bottom side 508 and camera mounting clips 548 that are attached to the bracket body 504. The camera mounting clips 548 are configured to receive and secure the camera (not shown) on the bottom side 508 and near the leading end 516 of the bracket body 504. In other embodiments, the glare shield 532 may be integrally formed with the bracket body 504.

Referring to FIG. 9, the glare shield 532 includes an aperture 552 at the trailing end 520 of the bracket body 504 and a field of view 556 that extends from the aperture 552 toward the leading end 516 of the bracket body 504. The field of view 556 extends between opposing sidewalls 560, 562 of the glare shield 532 and along an upper surface 564 that extends outwardly from the aperture 552 toward the leading end 516. A longitudinal axis 568 intersects the aperture 552 and extends centrally along the glare shield 532 from the trailing end 520 to the leading end 516 of the bracket body 504. It will be appreciated that a viewing angle 572 of the field of view 556 is defined by the glare shield 532 between the sidewalls 560, 562, and the longitudinal axis 568 bisects the viewing angle 572. Accordingly, when the camera (not shown) is mounted at the aperture 552, the camera (not shown) has visibility across an entirety of the viewing angle 572 of the field of view 556. When the bracket assembly 500 is mounted to the windshield 132 of the vehicle 136 (see FIG. 12), the camera (not shown) is configured to view through the field of view 556 and through the windshield 132 to detect, e.g., traffic lines, other vehicles, pedestrians, objects or landscapes, and sunlight or moonlight, among other possibilities.

In the illustrated embodiment of FIGS. 8 and 9, the circuit carrier 512 extends along the trailing end 520 and near the right side 528 of the bracket body 504, although other configurations are possible. The circuit carrier 512 can be provided in the form of a printed circuit board (PCB), a rigid circuit board having a circuit formed or carried on a rigid substrate, or a flex circuit (FC) or a circuit formed on a flexible substrate, among other types of circuit boards. The circuit carrier 512 includes leads 576 formed therein, which are represented by a dashed line for illustrative purposes in FIG. 8. The circuit carrier 512 and the leads 576 form a circuit 580 that provides communication lines for electricity across the circuit carrier 512. Accordingly, the circuit carrier 512, including the circuit 580 and the leads 576, extend along or across the bracket body 504. Further, the circuit carrier 512 includes a plurality of terminal blocks 584 for making electrical connections with electrical devices and the leads 576. For example, the circuit carrier 512 may be electrically coupled to a power source (not shown) and a controller (not shown) by way of connections made at the terminal blocks 584. In the illustrated embodiment, the circuit carrier 512 is electrically connected to a first electrical device 588, such as, e.g., a rain sensor, and a second electrical device 592, such as, e.g., a humidity sensor. The circuit carrier 512 may also include a contact pad, such as the contact pad 184 of FIG. 2, and a spring-loaded contact, such as the spring-loaded contact 188 of FIG. 2.

Further, the circuit carrier 512 may be electrically connected to an interface 596 that is electrically coupled to wiring 600 for a third electrical device 604, e.g., a heater, provided separately from or with the glare shield 532. As such, the circuit carrier 512 may be electrically coupled to the glare shield 532 to provide control and power to the third electrical device 604. In the illustrated embodiment, the third electrical device 604 is attached to the leading end 516 of the glare shield 532. In some embodiments, the third electrical device 604 can be applied to the upper surface 564 of the glare shield 532 between the sidewalls 560 and also between the aperture 552 and the leading end 516. In some embodiments, the third electrical device 604 is provided in the form of a variable resistive heater, a fixed resistance heater, or the like. In some embodiments, the third electrical device 604 is a heater that is configured to increase the temperature of the glare shield 532 and, when the bracket assembly 500 is mounted to the windshield (not shown), to provide heat to the windshield (not shown) and the glare shield 532 to clear the field of view 556 from, e.g., frost or condensation.

In the illustrated embodiment, the first electrical device 588 is received within a first receptacle 608 and secured by a first retaining clip 612 fastened to a first retention portion 616 of the bracket body 504 to prevent displacement therefrom. The first electrical device 588 is electrically connected to the circuit carrier 512 by a first set of wires 620, which may be soldered, fastened, or otherwise attached to the circuit carrier 512. In some embodiments, the first set of wires 620 is connected to the terminal blocks 584. In some embodiments, the first set of wires 620 of the first electrical device 588 are replaced with or modified to include a spring-loaded contact or connector pins. Further, the second electrical device 592 is received within a second receptacle 624 of the bracket body 504 and secured to a second retention portion 628 of the bracket body 504 by second retaining clips 632. The second electrical device 592 is electrically connected to the circuit carrier 512 by a second set of wires 636, which also may be fastened or soldered or otherwise attached to the circuit carrier 512. In some embodiments, the second set of wires 636 is connect to the terminal blocks 584. In some embodiments, the second set of wires 636 of the second electrical device 592 is replaced with or modified to include a spring-loaded contact or connector pins. In some embodiments, the circuit carrier 512 is electrically connected to other sensors and/or the camera (not shown), among other electrical devices. For example, a third receptacle 640 is positioned on the left side 524 of the bracket body 504, opposite the first and second receptacles 608, 624 relative to the glare shield 532. The third receptacle 640 is illustrated in FIGS. 8 and 9 as having a placeholder panel 644 attached therein, but the third receptacle 640 is configured to receive another type of electrical device different from the first electrical device 588 and the second electrical device 592, such as, e.g., heater, a camera, or a LIDAR sensor, among others.

Accordingly, the circuit carrier 512 consolidates and centralizes the electrical connections among the electrical devices on the bracket assembly 500, which minimizes the number of components provided with the bracket assembly 500. As a result, there are fewer components for assembly, which reduces the risk of lost or misplaced components, thereby reducing the risk of mishandling or mis-assembly. Additionally, due to the reduction in component parts, the need for packaging materials, e.g., plastic bags or containers, is minimized or eliminated, thereby mitigating waste and impacts to the environment.

With continued reference to FIG. 8, the circuit carrier 512 is attached to the bottom side 508 of the bracket body 504 during an assembly process. In some embodiments, the circuit carrier 512 is attached to the bracket body 504 by fasteners, such as, e.g., clips, posts, screws, or the like. In other embodiments, the circuit carrier 512 is affixed to the bracket body 504 by an adhesive. The circuit carrier 512 can be removably attached to the bracket body 504 or, alternatively, the circuit carrier 512 can be permanently attached to the bracket body 504. In some embodiments, the circuit carrier 512 is shaped and sized differently than illustrated in FIG. 8. For example, the circuit carrier 512 may extend along an entirety of the leading end 516 of the bracket body 504 between the left and right sides 524, 528. In other examples, the circuit carrier 512 may be positioned entirely on the right side 528 or entirely on the left side 524 of the bracket body 504. In some embodiments, the circuit carrier 512 is attached to the top side 514 of the bracket body 504 (see FIG. 9).

Figure 10:
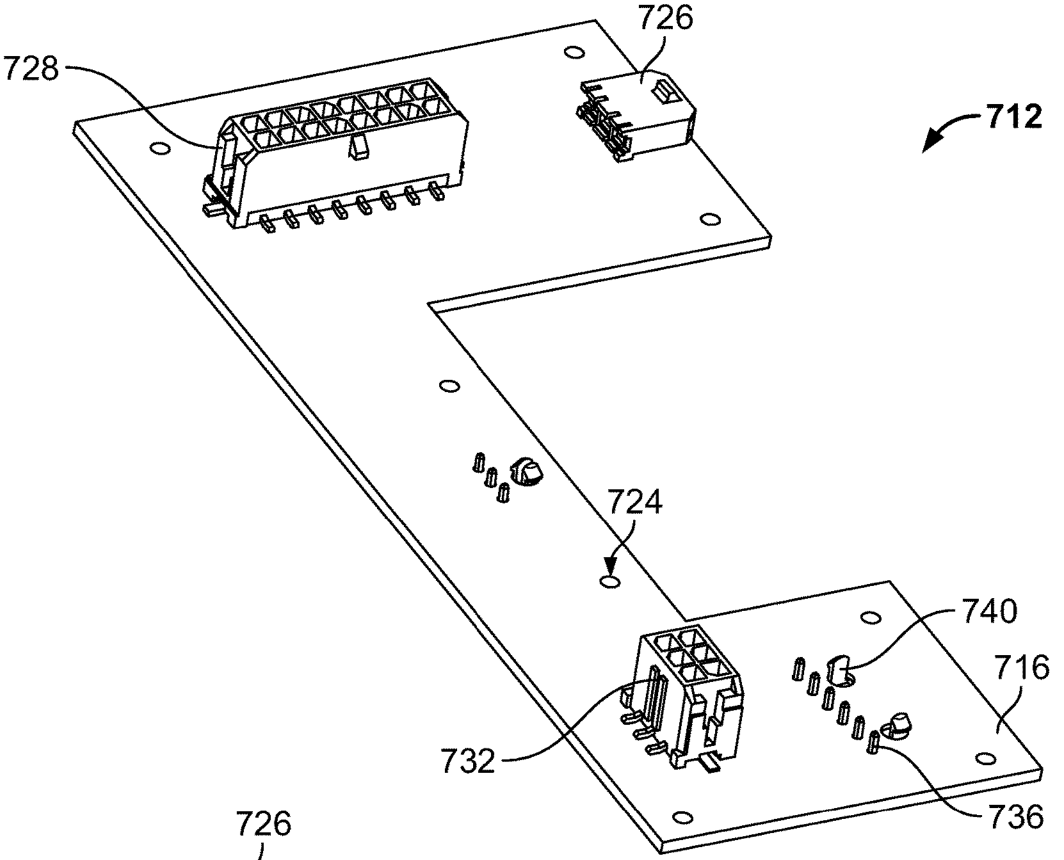
FIGS. 10 and 11 are schematic representations of isometric views of another embodiment of a circuit carrier.
Figure 11:
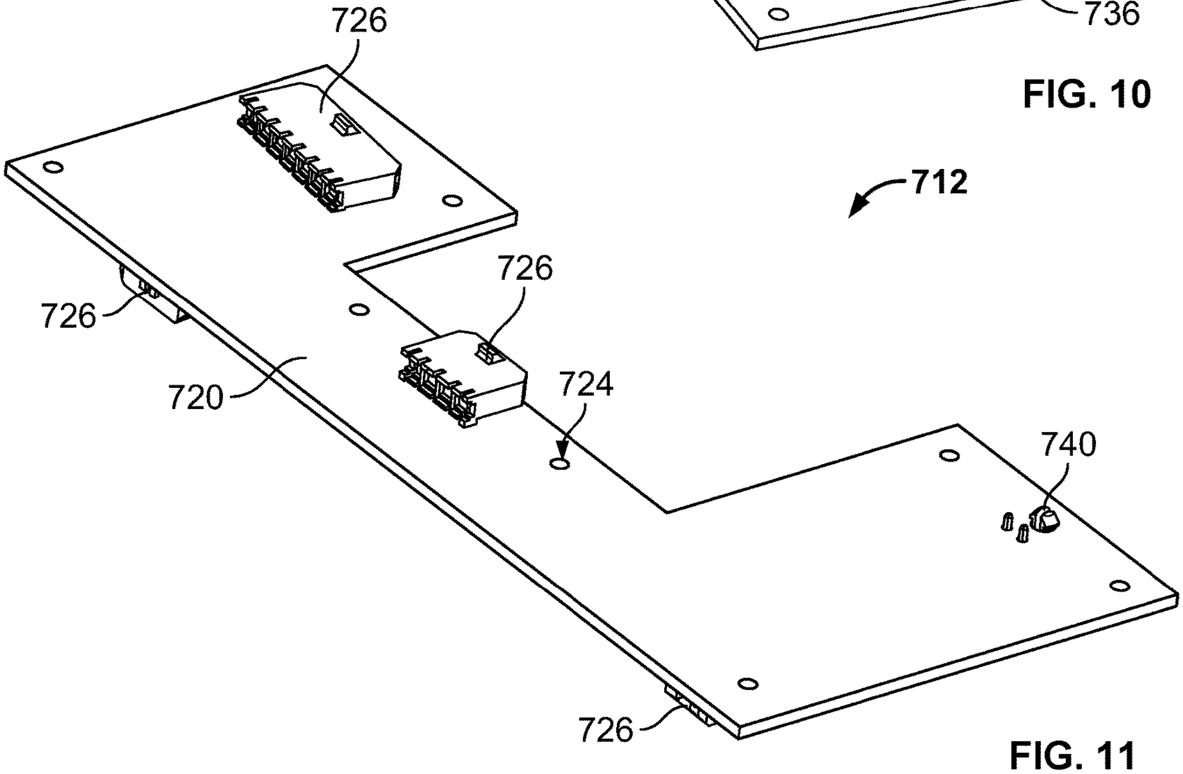

FIGS. 10 and 11 depict another embodiment of a circuit carrier 712 for use with the bracket assembly 500 of FIGS. 8 and 9. The circuit carrier 712 can be provided in the form of a printed circuit board (PCB), a rigid circuit board having a circuit formed or carried on a rigid substrate, or a flex circuit (FC) or a circuit formed on a flexible substrate, among other types of circuit boards. The circuit carrier 712 includes a first side 716 and a second side 720 (see FIG. 11). A plurality of mounting holes 724 are arranged on the circuit carrier 712 and extend through the first side 716 and the second side 720. The mounting holes 724 are configured to receive mounting posts (not shown) therethrough for attachment to the bracket body 504. In some embodiments, the mounting holes 724 receive fasteners, clips, or brackets, among other configurations. The circuit carrier 712 also includes terminal blocks 726, including a large terminal block 728, such as, e.g., a sixteen pin terminal block, and a small terminal block 732, such as, e.g., a six-pin terminal block, on the first side 716. Additionally, the first side 716 of the circuit carrier 712 includes a plurality of terminals or pins 736 to which wires may be coupled by, e.g., soldering, fastening, or adhering. Further, one or more of the terminal blocks 726 may be provided on the circuit carrier 712 along the first side 716 and, also, on the second side 720 (see FIG. 11). In the illustrated embodiment, the terminal blocks 726 are attached to the circuit carrier 712 by snap-in plugs 740 that extend to the opposite side of the circuit carrier 712. The terminal blocks 726 are arranged for electrical connections to devices, such as, e.g., a heater, a camera, a sensor, a power supply, a USB or USB-C port, a controller, or a wiring harness, among other connections. It is contemplated that the circuit carrier 712 can be attached to the bottom side 508 of the bracket body 504 (see FIG. 8), although other configurations are possible.

Figures 12, 13:
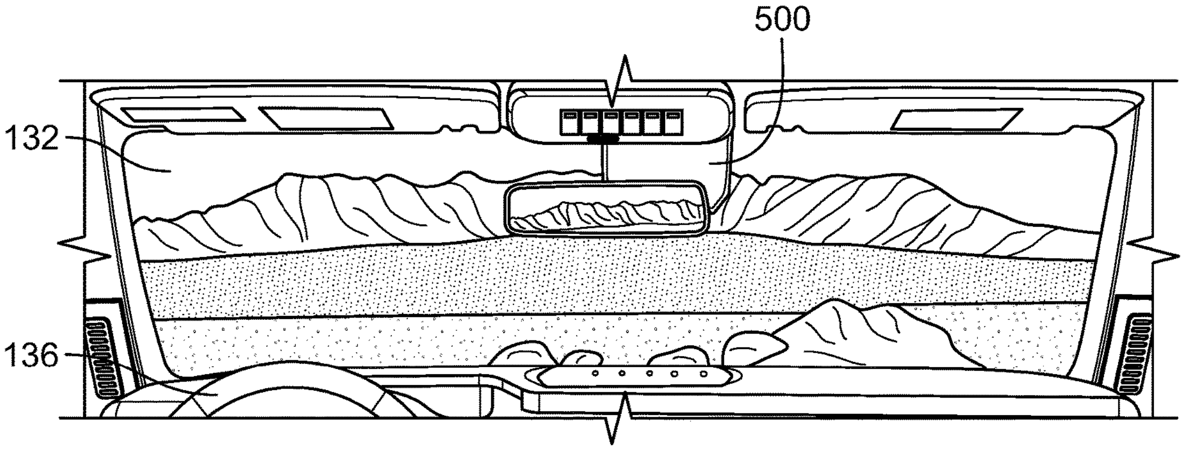
FIG. 12 is a schematic representation of the bracket assembly of FIG. 8 being attached to a windshield of a vehicle.
FIG. 13 is a flow diagram illustrating an exemplary assembly process, according to an embodiment of the present disclosure.

FIG. 12 illustrates the windshield 132 of the vehicle 136 to which the bracket assembly 500 is attached. The bracket assembly 500 is arranged on the windshield 132 so that the top side 514 (see FIG. 2) faces toward the windshield 132 and forwardly into the vehicle's forward direction of travel. As such, the bracket assembly 100 is configured to operate as part of, for example, a lane departure warning (LDW) system and/or an automatic emergency braking system, among other functionalities. It will be appreciated that each of the bracket assemblies 100, 200, 300, 400, 500 of the present disclosure are intended to be mounted to the windshield 132 of the vehicle 136, as depicted in FIG. 12.

FIG. 13 depicts a flow diagram for an exemplary process of assembling a bracket assembly for a vehicle. For purposes of clarity, the following steps of the assembly process of FIG. 13 will be described with reference to the bracket assembly 500 of FIGS. 8 and 9. It will be appreciated that the assembly process of FIG. 13 or modifications thereof can be performed with any of the bracket assemblies 100, 200, 300, 400, 500 of the present disclosure.

In step S100, the bracket body 504, the glare shield 532, the circuit carrier 512, and the electrical devices, e.g., the first electrical device 588 and the second electrical device 592, are provided to an installer. In some embodiments, the installer receives the bracket body 504 with the windshield 132, such that the bracket body 504 is at least partially attached to the windshield 132. In some embodiments, the glare shield 532 is fastened to the bracket body 504 by an installer, while in other embodiments the glare shield 532 is pre-fastened before receipt by the installer. In some embodiments, the glare shield 532 is integrally formed with the bracket body 504. Further, step S100 may include providing wiring 600 and the third electrical device 604 for connection between the bracket body 504 and the glare shield 532. Additionally, the circuit carrier 512 and the first and second electrical devices 588, 592 are provided to the installer separately from the bracket body 504 for subsequent installation.

In step S104, the first and second electrical devices 588, 592 are connected to the circuit carrier 512 to form a subassembly, e.g., the bracket assembly 500 in the partially installed state depicted in FIGS. 8 and 9. Step S104 can be performed at a workstation on a surface over which the installer may ergonomically make the electrical connections between the first and second electrical devices 588, 592 and the circuit carrier 512. Accordingly, the workstation is preferably provided with the appropriate tools, e.g., a soldering iron and soldering materials, optical devices, such as, e.g., an articulating arm or a headband with a magnifying glass, and protective equipment, such as, e.g., protective eyewear and gloves. Thus, making the electrical connections between the first and second electrical devices 588, 592 and the circuit carrier 512 at the workstation offers several advantages over making such connections inside the vehicle 136.

In step S108, the subassembly, including the circuit carrier 512 and first and second electrical devices 588, 592, is attached to the bracket body 504 on the windshield 132. In some instances, the windshield 132 and the bracket body 504 are already mounted to the vehicle 136 and, thus, the subassembly is attached to the windshield 132 in the vehicle 136. In other instances, the windshield 132 and the bracket body 504 are separated from the vehicle 136 and, thus, the subassembly is attached to the windshield 132 before being installed in the vehicle 136. Accordingly, the subassembly can be attached to the vehicle 136 in various ways. It is contemplated that where the bracket body 104 includes the integrally formed circuit 172, the bracket body 104 may be electrically connected to the first and second electrical devices 588, 592 prior to being installed on the windshield 132.

Accordingly, the bracket assemblies 100, 200, 300, 400, 500 of the present disclosure afford for an assembly process that involves fewer steps due to the reduction in component parts. In this way, the assembly process is simplified and requires less touches, which leads to reduced assembly times. Further, the assembly process can be performed ergonomically at the workstation, rather than in an awkward position inside the vehicle.

The entire disclosure of each patent and publication cited herein is incorporated by reference, as if each such patent or publication were individually incorporated by reference herein.

INDUSTRIAL APPLICABILITY

Numerous modifications to the present invention will be apparent to those skilled in the art of bracket assemblies in view of the foregoing description. Accordingly, this description is to be construed as illustrative only and is presented for the purpose of enabling those skilled in the art to make and use the invention. The exclusive rights to all modifications which come within the scope of the appended claims are reserved.

We claim:

1. A bracket assembly for a vehicle, the bracket assembly comprising:

a bracket body having a glare shield and a circuit; and an electrical device, wherein the electrical device is electrically connected to the circuit of the bracket body, and wherein the circuit comprises a plurality of conductive leads integrally formed and non-removably coupled within a top side and a bottom side of the bracket body and extending along the bracket body.

2. The bracket assembly of claim 1, wherein the electrical device is connected to a contact pad that is integrally formed on the bracket body.

3. The bracket assembly of claim 1, wherein a spring-loaded contact is provided between the electrical device and the circuit.

4. The bracket assembly of claim 1, wherein the electrical device includes at least one of a heater, a camera, a humidity sensor, a rain sensor, or a port.

5. The bracket assembly of claim 1, wherein a wire harness is provided between the circuit and a power source.

6. The bracket assembly of claim 5, wherein the wire harness is a two-pin wire harness or a three-pin wire harness.

7. The bracket assembly of claim 1, wherein the glare shield is removably attached to the bracket body.

8. A bracket assembly for a vehicle, the bracket assembly comprising:

a bracket body having a leading end and a trailing end opposite the leading end, wherein the trailing end is configured to be positioned rearwardly of the leading end relative to a front of the vehicle;

a glare shield integrally formed with the bracket body;

a circuit subassembly that is configured to be attached to the bracket body, the circuit subassembly comprising:

an electrical device; and a circuit carrier extending along the trailing end or the leading end of the bracket body, wherein the electrical device is electrically connected to a terminal block provided on the circuit carrier to form the circuit subassembly that is attached to a bottom side or a top side of the bracket body; and a heater electrically coupled to the glare shield, and wherein the terminal block of the circuit carrier is electrically coupled to the heater.

9. The bracket assembly of claim 8, wherein the circuit carrier is attached to the bottom side of the bracket body.

10. The bracket assembly of claim 8, wherein the circuit carrier is positioned along the trailing end of the bracket body.

11. The bracket assembly of claim 8, wherein the electrical device includes at least one of a heater, a camera, a humidity sensor, a rain sensor, or a port.

12. The bracket assembly of claim 8, wherein the bracket body includes a retention portion and the electrical device includes a retaining clip that is configured to engage the retention portion.

13. A method of assembling a bracket assembly for a vehicle, the method comprising:

providing a bracket body and a glare shield;

providing a circuit carrier and a plurality of electrical devices, wherein the plurality of electrical devices are connected to the circuit carrier to form a circuit subassembly;

attaching the circuit subassembly to the bracket body to form the bracket assembly, wherein the circuit carrier and the plurality of electrical devices are directly attached to a first side of the bracket body, and wherein the plurality of electrical devices includes a heater electrically coupled to the glare shield; and installing the bracket assembly to the vehicle.

14. The method of claim 13, wherein each electrical device of the plurality of electrical devices is connected to the circuit carrier before being attached to the bracket body.

15. The method of claim 13, wherein the electrical devices include at least one of a camera, a humidity sensor, a rain sensor, or a port.

16. The method of claim 13, wherein the circuit carrier is attached to the first side of the bracket body by a fastener, wherein the first side is a bottom side.

17. The method of claim 13, wherein the circuit carrier includes a plurality of terminal blocks of different configurations.

18. The method of claim 13, wherein the circuit carrier includes a first terminal block on a first side of the circuit carrier and a second terminal block on a second side of the circuit carrier that is opposite the first side.

* * * * *